United States Patent
Feng et al.

(10) Patent No.: US 9,340,893 B2
(45) Date of Patent: May 17, 2016

(54) FRONT REFERENCED ANODE

(71) Applicant: Novellus Systems, Inc., Fremont, CA (US)

(72) Inventors: Jingbin Feng, Lake Oswego, OR (US); R. Marshall Stowell, Wilsonville, OR (US); Shantinath Ghongadi, Tigard, OR (US); Zhian He, Lake Oswego, OR (US); Frederick Dean Wilmot, Gladstone, OR (US)

(73) Assignee: Novellus Systems, Inc., Fremont, CA (US)

(*) Notice: Subject to any disclaimer, the term of this patent is extended or adjusted under 35 U.S.C. 154(b) by 0 days.

(21) Appl. No.: 14/678,686

(22) Filed: Apr. 3, 2015

(65) Prior Publication Data

US 2015/0211144 A1    Jul. 30, 2015

Related U.S. Application Data (63) Continuation of application No. 12/879,484, filed on Sep. 10, 2010, now Pat. No. 9,028,657.

(51) Int. Cl.
| | | |
|---|---|---|
| *C25D 17/12* | (2006.01) | |
| *C25D 17/00* | (2006.01) | |
| *C25D 17/06* | (2006.01) | |
| *C25D 17/10* | (2006.01) | |
| *C25D 7/12* | (2006.01) | |

(52) U.S. Cl.
CPC ............... *C25D 17/12* (2013.01); *C25D 7/123* (2013.01); *C25D 17/001* (2013.01); *C25D 17/06* (2013.01); *C25D 17/10* (2013.01)

(58) Field of Classification Search
CPC .............. C25D 7/12–7/126; C25D 17/001; C25D 17/06; C25D 17/10; C25D 17/12; C25D 17/14
USPC ................................................. 204/297.01
See application file for complete search history.

(56) References Cited

U.S. PATENT DOCUMENTS

| | | |
|---|---|---|
| 4,721,601 A | 1/1988 | Wrighton et al. |
| 5,938,899 A | 8/1999 | Forand |
| 5,985,126 A | 11/1999 | Bleck et al. |
| 6,126,798 A | 10/2000 | Reid et al. |
| 6,156,167 A | 12/2000 | Patton et al. |
| 6,179,983 B1 | 1/2001 | Reid et al. |
| 6,228,232 B1 | 5/2001 | Woodruff et al. |
| 6,402,923 B1 | 6/2002 | Mayer |
| 6,569,299 B1 | 5/2003 | Reid et al. |
| 6,755,954 B2 | 6/2004 | Mayer et al. |
| 6,800,187 B1 | 10/2004 | Reid et al. |

(Continued)

OTHER PUBLICATIONS

US Office Action, dated Mar. 13, 2013, issued in U.S. Appl. No. 12/879,484.

(Continued)

*Primary Examiner* — Luan Van
*Assistant Examiner* — Alexander W Keeling
(74) *Attorney, Agent, or Firm* — Weaver Austin Villeneuve & Sampson LLP (57) ABSTRACT

Apparatus and methods for electroplating are described. Apparatus described herein include anode supports including positioning mechanisms that maintain a consistent distance between the surface of the wafer and the surface of a consumable anode during plating. Greater uniformity control is achieved.

14 Claims, 10 Drawing Sheets

(56) References Cited

U.S. PATENT DOCUMENTS

| | | | |
|---|---|---|---|
| 6,890,416 B1* | 5/2005 | Mayer et al. | 205/261 |
| 6,964,792 B1 | 11/2005 | Mayer et al. | |
| 7,316,602 B2 | 1/2008 | Basol et al. | |
| 7,622,024 B1 | 11/2009 | Mayer et al. | |
| 8,262,871 B1 | 9/2012 | Mayer et al. | |
| 9,028,657 B2 | 5/2015 | Feng et al. | |
| 9,045,840 B2 | 6/2015 | Porter et al. | |
| 2001/0020583 A1 | 9/2001 | Woodruff et al. | |
| 2002/0020627 A1 | 2/2002 | Kunisawa et al. | |
| 2004/0084316 A1 | 5/2004 | Muranaka | |
| 2005/0056538 A1* | 3/2005 | Kovarsky et al. | 204/252 |
| 2005/0092610 A1 | 5/2005 | Moore | |
| 2006/0243598 A1 | 11/2006 | Singh et al. | |
| 2007/0068819 A1* | 3/2007 | Singh | C25D 17/10 205/83 |
| 2007/0175752 A1 | 8/2007 | Yang et al. | |
| 2009/0211900 A1* | 8/2009 | Rash et al. | 204/276 |
| 2010/0032310 A1 | 2/2010 | Reid et al. | |
| 2010/0044236 A1 | 2/2010 | Mayer et al. | |
| 2010/0116672 A1 | 5/2010 | Mayer et al. | |
| 2010/0147679 A1 | 6/2010 | Feng et al. | |
| 2012/0061246 A1 | 3/2012 | Feng et al. | |
| 2013/0134045 A1 | 5/2013 | Porter et al. | |

OTHER PUBLICATIONS

US Final Office Action, dated Jul. 30, 2013, issued in U.S. Appl. No. 12/879,484.

US Office Action, dated Apr. 10, 2014, issued in U.S. Appl. No. 12/879,484.

US Office Action, dated Aug. 6, 2014, issued in U.S. Appl. No. 12/879,484.

US Notice of Allowance, dated Jan. 8, 2015, issued in U.S. Appl. No. 12/879,484.

US Office Action, dated Sep. 22, 2014, issued in U.S. Appl. No. 13/306,527.

US Notice of Allowance, dated Feb. 27, 2015, issued in U.S. Appl. No. 13/306,527.

* cited by examiner

FRONT REFERENCED ANODE

CROSS-REFERENCE TO RELATED APPLICATIONS

This application is a continuation of U.S. patent application Ser. No. 12/879,484, titled "Front Referenced Anode" filed Sep. 10, 2010 (issued as U.S. Pat. No. 9,028,657 on May 12, 2015), and naming Feng et al. as inventors, which is incorporated herein by reference in its entirety.

FIELD OF INVENTION

The invention relates generally to electroplating apparatus, more particularly improved anodes and anode assemblies and methods of electroplating a metal onto a work piece.

BACKGROUND

Electroplating uses electrical current to reduce cations of a desired material from a solution and coat a conductive object, the work piece, with a thin layer of the material, such as a metal. In a typical electroplating cell, the part to be plated is the cathode and the anode is made of the metal to be plated on the part. Both components are immersed in an electrolyte containing one or more dissolved metal salts as well as other ions that permit the flow of electricity through the electrolyte. Metal atoms of the anode are oxidized to ions, allowing them to dissolve in the electrolyte. In this manner, the ions in the electrolyte bath are continuously replenished by the anode. At the cathode, the dissolved metal ions in the electrolyte solution are reduced at the surface of the cathode, such that they "plate out" onto the cathode.

The above described method of plating uses a "consumable" anode, that is, during plating the anode is dissolved into the electrolyte and eventually is consumed and must be replaced in order to electroplate further. As the anode is consumed, it undergoes shape change during plating. This shape change can have detrimental effects on plating uniformity because the change in shape of the anode creates a change in the plating conditions. For example, the electric field shape and density between the work piece and the anode changes during plating due to the change in distance between the work piece and the anode due to the anode's consumption. In certain plating applications, for example electroplating a metal onto a semiconductor wafer, it is important to have highly uniform plating onto the semiconductor wafer. When plating layers that are very thin, on the order of angstroms or microns thick, and where uniformity is critical, even small changes in the anode's shape can create non-uniformities in the plated metal.

SUMMARY OF INVENTION

Apparatus and methods for electroplating are described. Apparatus described herein include anode supports including positioning mechanisms that maintain a consistent distance between the surface of the wafer and the surface of a consumable anode during plating. Greater uniformity control is achieved.

One embodiment is an electroplating apparatus, including: (a) a work piece holder for holding a work piece in place during electroplating; and (b) an anode support comprising an anode positioning mechanism for adjusting the position of a consumable anode to provide a consistent distance between the consumable anode and the work piece over a period of time during which the consumable anode is consumed. In one embodiment, the work piece holder is configured to hold a semiconductor wafer. In certain embodiments, the apparatus further includes the consumable anode, where the consumable anode includes a substantially planar surface that is substantially parallel to the plating surface of the semiconductor wafer during plating. In some embodiments, the substantially planar surface is at least co-extensive with the plating surface of the semiconductor wafer. The anode may have a unitary body, or in certain embodiments, the consumable anode includes two or more sections that, when registered with each other, form a disk-shaped anode. In one embodiment, the consumable anode includes four circular sectors having equivalent central angles. In certain embodiments, the consumable anode includes copper, and in one embodiment the consumable anode is copper.

In one embodiment, the anode positioning mechanism includes: (i) a support plate, for supporting the consumable anode; and (ii) a drive component, configured to apply upward force to the support plate sufficient to raise the anode. For example, with a disk shaped anode, the support plate is of sufficient area to support the anode, but need not be the same diameter as the anode. In one embodiment, the drive component includes one or more springs that are compressed between the support plate and a bottom region of a plating chamber and/or a base plate configured to lie in the bottom region of the plating chamber. In a specific embodiment, the one or more springs are compressed between the support plate and the base plate. The anode positioning mechanism may further include one or more hard stops configured to limit the distance that the consumable anode is pushed by the one or more springs or other drive mechanism and thereby maintain the consistent distance between the consumable anode and the work piece over the period of time during which the consumable anode is consumed.

In one embodiment, the support plate is annular with a hollow occupied by a charge plate, the charge plate configured to attach to the bottom of the consumable anode and attach to the base plate via one or more cables or other flexible conductive elements. The cables can be used to supply electricity to the anode.

Another embodiment is a method of electroplating a metal onto a work piece, the method including maintaining a consistent distance between the plating surface of the work piece and a surface of a consumable anode during plating, by adjusting the position of the consumable anode during plating to compensate for consumption of the surface of the consumable anode.

These and other features and advantages will be described in further detail below, with reference to the associated drawings.

BRIEF DESCRIPTION OF THE DRAWINGS

The following detailed description can be more fully understood when considered in conjunction with the drawings in which.

DETAILED DESCRIPTION

When electroplating a metal onto a semiconductor wafer, it is important to have highly uniform plating onto the semiconductor wafer, especially when plating layers that are very thin, on the order of angstroms or microns thick. In this regime, for example, uniformity is critical, and even small changes in the anode's shape can create non-uniformities in the plated metal. Conventional plating methods and tools address this challenge, for example, by manipulating the electrical field and current density by the use of, for example, auxiliary cathodes, field shaping elements and the like, to compensate, at least in part, for the changing gap distance and obligatory power increases that change the resistivity profile during plating. While these address non-uniformity and still hold value, it is desirable to avoid the issues associated with changing gap distance between the work piece and consumable anode during plating.

The inventors have found that by maintaining a consistent distance between the surface of the wafer and the surface of a consumable anode during plating, greater uniformity control is achieved. Other benefits of maintaining a consistent gap between the consumable anode and the wafer plating surface during plating include: 1) decreasing the sensitivity to resistive variations in the plating cell that occur due to the change in gap distance from the anode being consumed, 2) decreasing the sensitivity to resistive variations of electrolyte 3) obviating the power increase requirements that are obligatory when the distance between the cathode and anode increases, that is, a constant voltage may be applied during plating, 4) obviating the need for oversized power supplies, 5) avoiding early replacement the anode to reestablish a suitable gap between the work piece and the anode, 6) addressing anode passivation issues, and 7) lowering the cost of ownership for the anode and related plating apparatus. Anodes described herein may be thicker than conventional consumable anodes, and thus much longer times can be spanned before an anode needs to be changed. Since the gap between the anode surface and the work piece is maintained, for example within described tolerances, such thicker anodes can be more fully used, rather than sacrificing a large portion of the anode simply because an unacceptable variation in resistivity is established in the plating cell between the anode and work piece due to the gap increasing during plating.

Anodes described herein may have features for registering the anode with a support plate. Anodes may have a singular body or be assembled from two or more pieces to aid in assembling an anode positioning mechanism and attaching the anode to the positioning mechanism. Additional features that may be included as components of assemblies described herein include guide rods which register with channels in anodes in order to aid in assembly and/or function of the positioning mechanism or an anode support, one or more hard stops for maintaining a resistance against a force used to position the consumable anode, so that the consistent gap is maintained, and configurations that take into account space savings so that the assemblies fit into existing plating hardware.

One embodiment is an electroplating apparatus, including: (a) a work piece holder for holding a work piece in place during electroplating; and (b) an anode support comprising an anode positioning mechanism for adjusting the position of a consumable anode to provide a consistent distance between the consumable anode and the work piece over a period of time during which the consumable anode is consumed. In one embodiment, the work piece holder is configured to hold a semiconductor wafer. In certain embodiments, apparatus further include the consumable anode, where the consumable anode includes a substantially planar surface that is substantially parallel to the plating surface of the semiconductor wafer during plating. In some embodiments, the substantially planar surface is at least co-extensive with the plating surface of the semiconductor wafer. The term "at least co-extensive" means that the area of the surface of the anode is at least the same, if not greater than, that of the wafer. That is, the wafer "sees" anode surface at all points on the plating surface. Put another way, there is complete overlap of the anode surface being consumed and the plating surface of the wafer. In other embodiments, the anode's surface facing the wafer is smaller than that of the plating surface of the wafer. In one embodiment, for example where the anode has a disk shape, the aforementioned embodiments translate to the anode having the same or larger diameter than the plating surface of the wafer, or the anode having a smaller diameter than the plating surface of the wafer, respectively. The anode may have a unitary body, or in certain embodiments, the consumable anode includes two or more sections that, when registered with each other, form a disk-shaped anode. In one embodiment, the consumable anode includes four circular sectors having equivalent central angles. In certain embodiments, the consumable anode includes copper, and in one embodiment the consumable anode is copper.

The term "anode assembly" is meant to include an anode, anode support, positioning mechanisms and associated hardware that may be used in and/or be components of an electroplating apparatus. Thus anode assembly does not specifically require an assembly of anode segments used to make a consumable anode.

In one embodiment, the anode positioning mechanism includes: (i) a support plate, for supporting the consumable anode; and (ii) a drive component, configured to apply upward force to the support plate sufficient to raise the anode. For example, with a disk shaped anode, the support plate is of sufficient area to support the anode, but need not be the same diameter as the anode. In one embodiment, the drive component includes one or more springs that are compressed between the support plate and a bottom region of a plating chamber and/or a base plate configured to lie in the bottom region of the plating chamber. In a specific embodiment, the one or more springs are compressed between the support plate and the base plate. The anode positioning mechanism may further include one or more hard stops configured to limit the distance that the consumable anode is pushed by the one or more springs and thereby maintain the consistent distance between the consumable anode and the work piece over the period of time during which the consumable anode is consumed.

The hard stop may include an annular structure. In one embodiment, the hard stop includes a spoked wheel structure including a plurality of flutes for delivering electrolyte flow onto to the consumable anode. In such embodiments, the annular structure, for example the spoked wheel structure, may include one or more protrusions that rest against the consumable anode during consumption of the consumable anode and prevent the anode from touching the main body and/or the plurality of flutes of the spoked wheel structure.

In one embodiment, the support plate is annular with a hollow occupied by a charge plate, the charge plate configured to attach to the bottom of the consumable anode and attach to the base plate via one or more cables.

One embodiment is the electroplating apparatus as described above, further including: (i) an ionically resistive ionically permeable element shaped and configured to be positioned between the work piece and the consumable anode during electroplating, the ionically resistive ionically permeable element having a flat surface that is substantially parallel to and separated from a plating face of the work piece by a gap of about 5 millimeters or less during electroplating; and (ii) an auxiliary cathode located between the consumable anode and the ionically resistive ionically permeable element, and peripherally oriented to shape the current distribution from the consumable anode, while the auxiliary cathode is supplied with current during electroplating. In one embodiment, the ionically resistive ionically permeable element has an ionically resistive body with a plurality of non-communicating channels through the body, wherein said plurality of non-communicating channels allow for transport of ions through the element, and wherein substantially all channels have a principal dimension or a diameter of the opening on the surface of the element facing the surface of the work piece of no greater than about 5 millimeters. In one embodiment, the ionically resistive ionically permeable element is a disk having between about 6,000-12,000 channels and/or has a porosity of about 5% porous or less. In another embodiment, the ionically resistive ionically permeable element is a disk having less than 6,000 channels and/or has a porosity of greater than 5%. Electroplating apparatus may further include a second auxiliary cathode located in substantially the same plane as the plating surface of the work piece during electroplating, and adapted for diverting a portion of ionic current from an edge region of the work piece. In one embodiment, the second auxiliary cathode is located peripheral to the work piece holder and radially outward of a peripheral gap between the ionically resistive ionically permeable element and the work piece holder. In one embodiment, the (first) auxiliary cathode is a virtual auxiliary cathode having an associated physical cathode housed in a cavity in a plating chamber, wherein the cavity is in ionic communication with the plating chamber. Electroplating apparatus may further include a second ionically resistive ionically permeable element, wherein the second ionically resistive element is positioned proximate the auxiliary cathode. These features will be discussed in more detail below, in relation to the associated drawings.

Figure 1:
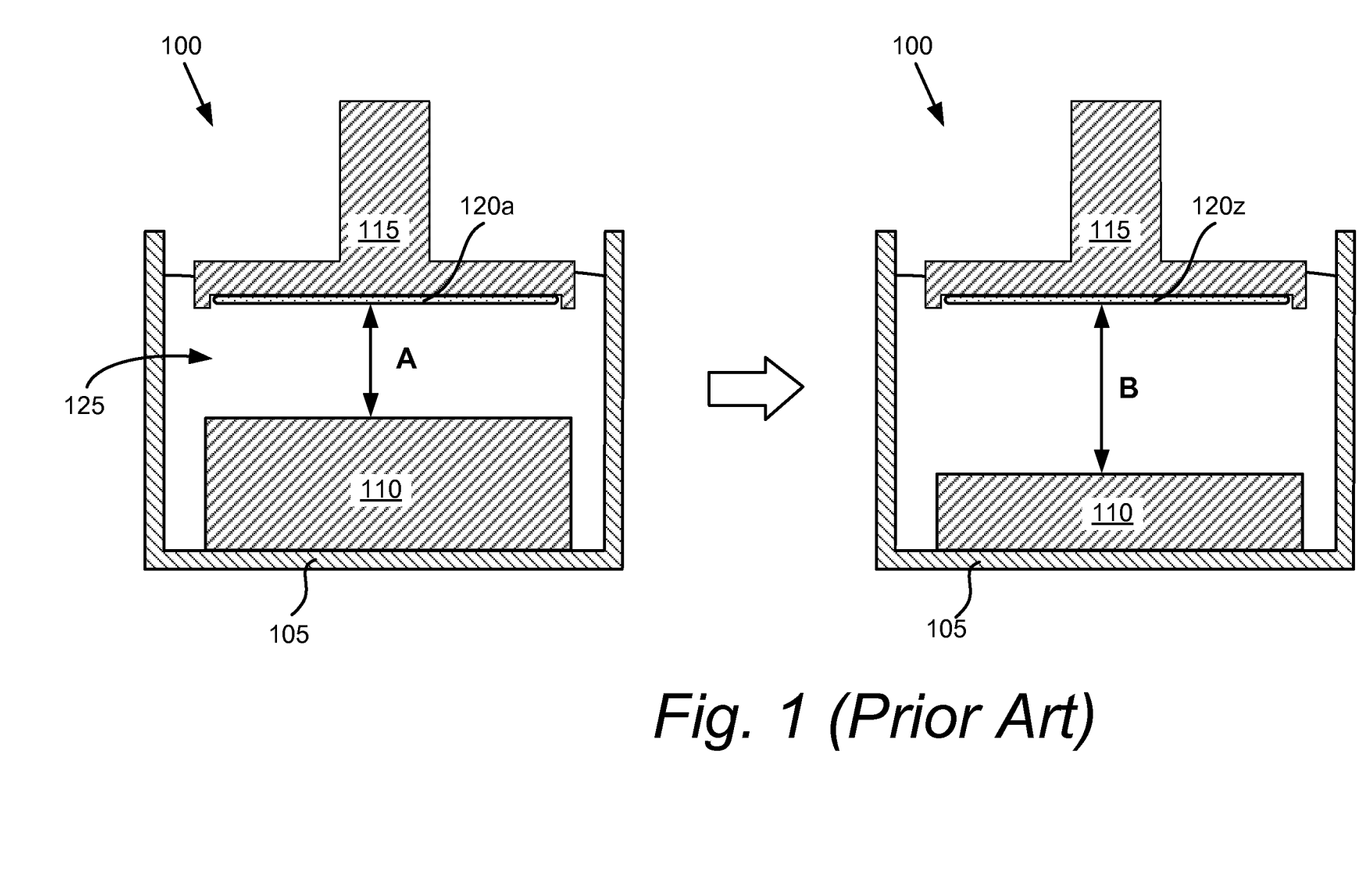
FIG. 1 is a cross section schematic of conventional plating apparatus.

FIG. 1 depicts cross section schematics of an electroplating apparatus, 100, at the start of plating and after having plated a number of work pieces. Apparatus 100 includes a plating cell, 105, which has a consumable anode, 110. In this example, the work piece is a semiconductor wafer, 120a, which is held by a wafer holder, 115. An electrolyte, 125, is used to carry charge between the wafer and the anode, across a distance A, and electroplate metal ions from consumable anode 110 onto wafer 120a. The right portion of FIG. 1, shows apparatus 100, after a number of wafers have been processed in the system. In this example, wafer 120z is being plated. Anode 110 has been partially consumed and the distance between the wafer and the anode is now larger, distance B. As mentioned, this change in distance corresponds to a change in resistivity and a corresponding change in uniformity of plated metal onto the wafers being plated in the apparatus.

One could conceivably change the (vertical) position of the wafer to maintain the gap between the wafer and the anode surface; however, it is typically the case where the conditions at and around the wafer surface are carefully controlled during plating. For example, auxiliary cathodes and resistive elements are also used to shape the field near the wafer surface to aid in uniform plating. Thus, essentially, as the anode is consumed it is moving away from the carefully controlled environment at and around the wafer. Moving the wafer would disturb this environment and make maintaining the carefully configured field more difficult. The inventors realized that since the anode is essentially moving away from this carefully configured local environment as it is consumed, it would be beneficial to develop technology that would allow the anode's plating surface to stay positioned substantially as when plating started as it is consumed, so that the gap between the wafer and the anode is maintained.

Figure 2:
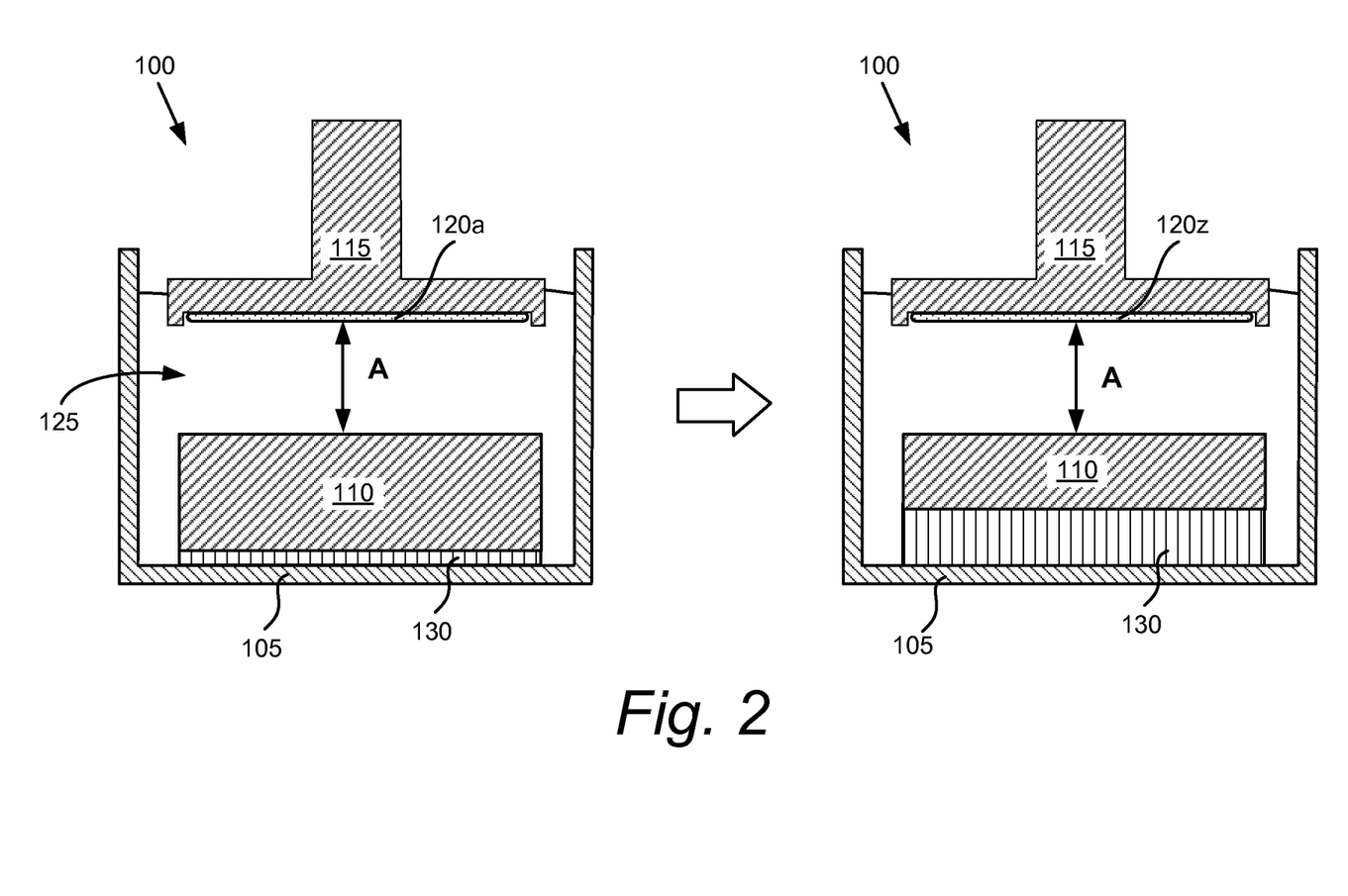
FIG. 2 is a cross section schematic of plating apparatus described herein.

FIG. 2, depicts plating apparatus 100, with an anode support, 130, as described herein. Anode support 130 includes a positioning mechanism (not shown) which positions the anode during plating so that the optimal distance, A, is maintained throughout plating. In this example the distance is maintained from plating onto wafer 120a to wafer 120z, even though a significant portion of anode 110 has been consumed. FIGS. 3A-5E show more detailed examples of apparatus incorporating such anode supports. Anode positioning mechanisms include components for applying a force, in many instances and upward force, against the consumable anode in order to maintain the gap between the anode and the work piece. This force may be supplied by, for example, hydraulics, springs, screw drives, and the like.

Figure 3A:
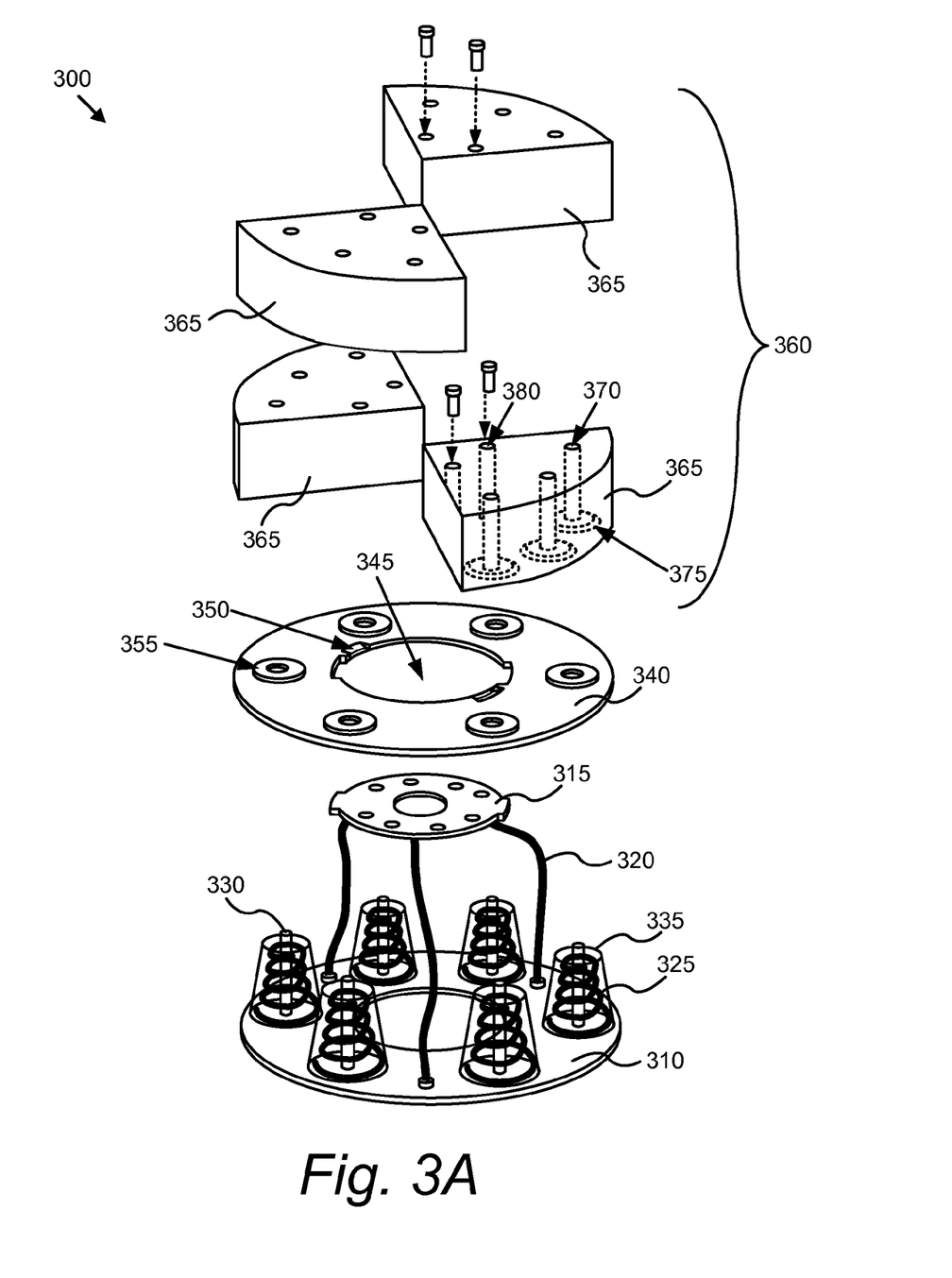
FIGS. 3A-3C depict various illustrations of anode assemblies described herein.

FIG. 3A shows a perspective of an anode assembly, 300, which includes an anode support which includes base plate, 310, charge plate, 315 and support plate, 340. Assembly 300 resides in a plating cell (depicted in FIGS. 3B and 3C) during plating. On base plate 310 are a series of springs 325. In this example, springs 325 have elastomeric boots, 335, that envelope the springs and protect them from the corrosive electrolyte during plating. Base plate 310 also includes a series of guide rods, 330, each located in the center of a spring 325. Boots 335 can slidably engage guide rods 330, that is, when springs 325 are compressed, the boots slide down the guide rods and form a seal so that electrolyte doesn't come in contact with the springs. Charge plate 315 is connected to base plate 310 via cables 320. Cables 320 are used to carry current to the charge plate from a power source (not shown). In one embodiment, cables 320 are titanium. In another embodiment, charge plate 315 is also titanium. Base plate 310 may also be titanium. In one embodiment, cables 320 are affixed to base plate 310 via crimp tubes (see for example FIG. 5A) that are welded onto base plate 310. Cables 320 may also be, for example, bolted to the base plate and/or the charge plate. In one embodiment, the springs may be coated with a polymeric material that protects them, with or without boots as described. In one embodiment, the polymeric material is Teflon. In one embodiment, the springs are stainless steel.

Figure 3B:
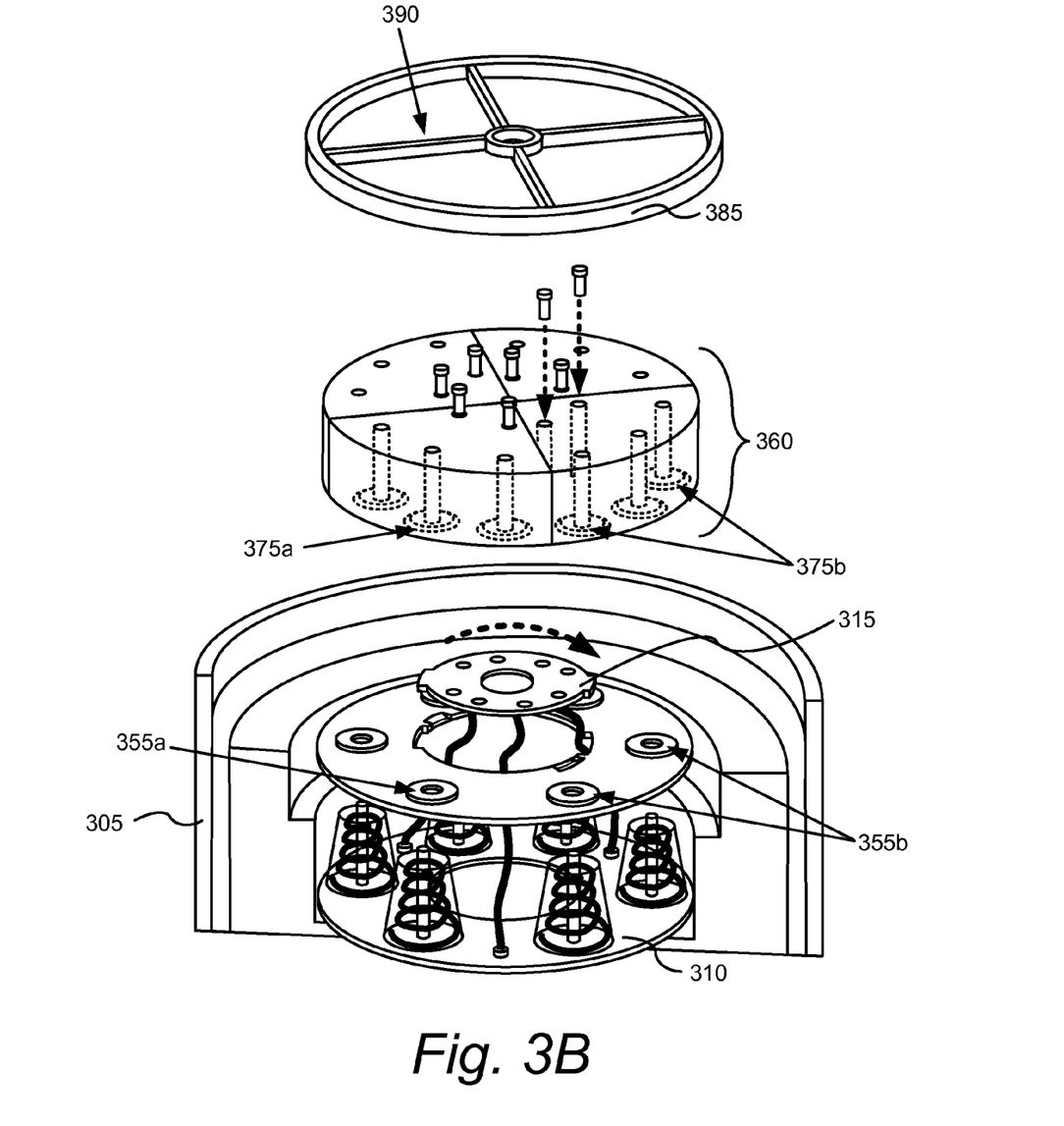

Support plate 340 has a hollow, 345, which suitable for charge plate 315 to pass through. In this example, the support plate also includes recesses, 350, which accommodate tabs on the perimeter of charge plate 340 to in order to engage and register the charge plate with the support plate. Support plate 340 also has one or more protrusions, 355, which engage with recesses 375 on the anode. In this example, protrusions 355 also have apertures which allow guide posts 330 to pass through when the support plate is resting on and compressing springs 325. One of ordinary skill in the art would appreciate that springs 325, that lift support plate 340, need not necessarily rest against a base plate, but could rest against a bottom region of a plating cell, or both. Referring to FIG. 3B, in this example, depression 375a registers with protrusion 355a on support plate 340, while depressions 375b, register with protrusions 355b on the support plate. Thus alternating anode sectors, 365, register with one or two protrusions on the support plate, respectively.

In this example, the consumable anode, 360, includes four sections, which are circular sectors, 365, having 90° central angles. Anodes of the invention are not limited to this configuration, they may have a unitary body, or more or less sections, for example, two half-circles that register to make a disk shaped anode, three circular sectors with 120° central angles, etc. Each sector 365 has a number of through channels. In this example, through channels, 380, are used to pass fasteners, for example bolts, down through the channels and fasten the anode sectors to the charge plate. Anode sectors 365 also have through channels, 370, which allow guide rods 330 to pass through them when the anode is resting on support plate 340 and springs 325 are at least partially compressed. Anode sectors 365 also have depressions, 375, which register with protrusions 355 on support plate 340 when the anode is positioned on the support plate. Collectively, springs 325 have sufficient strength to lift anode 360 from their compressed state to their extended state.

Referring to FIG. 3B, which depicts assembly 300 as well as a plating cell, 305, in order to assemble apparatus 300, charge plate 315 is brought through hollow 345 in support plate 340. Cables 320 are sufficiently long so as to allow charge plate to pass through the hollow, at least when springs 325 are compressed. In this example, charge plate 315 is rotated (as indicated by the heavy dashed arrow) in order to register its perimeter tabs with depressions 350. In this example, when registered with support plate 340, the charge plate is substantially in the same plane as support plate 340. In one embodiment, cables 320 are configured such that springs 325 must be compressed, for example by applying downward force to the support plate against the springs, in order for the charge plate to pass through the hollow in the charge plate. Once the charge plate's perimeter tabs are registered with depressions 350 in the support plate, the downward force against the support plate is ceased and the support plate pushes up against the charge plate via the depressions 350 pushing upwards on the perimeter tabs. In this way, a unitary support assembly is made from the support plate and the charge plate. Anode sectors 365 are bolted to the charge plate (in some embodiments the anode sectors are also fastened to each other, infra). The support assembly holds the anode such that springs 325 are extended. Then the anode, charge plate and support plate are collectively pushed downward in order to compress springs 325. In this example, plating cell 305 has a hollow for accommodating anode assembly 300.

Figure 3C:
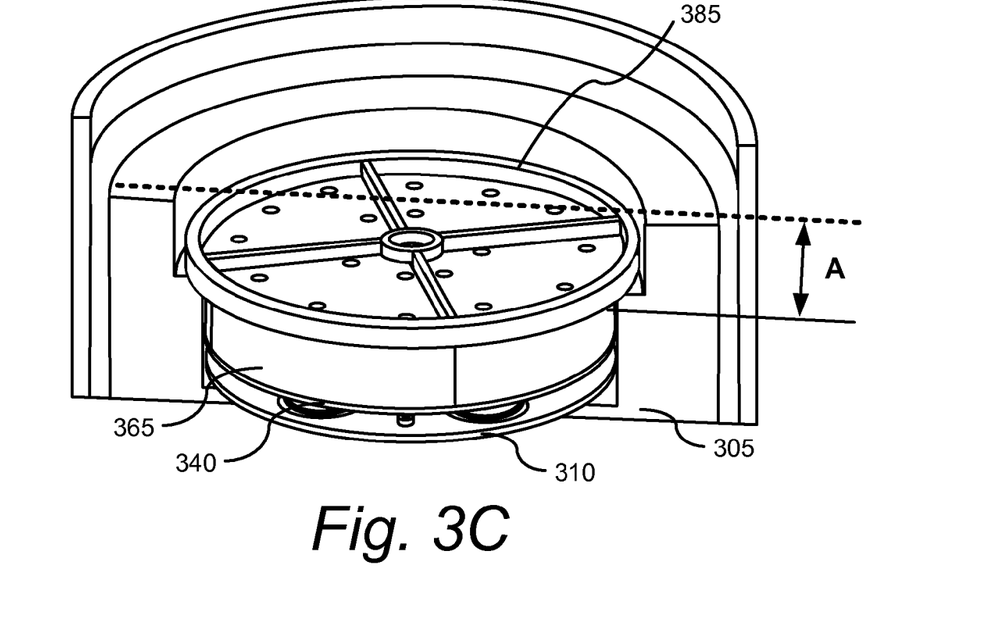

While the anode assembly is compressed in the hollow of plating cell 305, a hard stop, 385, in this example having an annular structure with spokes, 390, is fastened to the top of the hollow in cell 305, in order to hold anode 360 in place, against the force of springs 325 which push upwardly against the hard stop. FIG. 3C depicts the hard stop in place, holding the anode down in the hollow of plating cell 305. Using this assembly, during plating, as the surface of anode 360 is consumed, the force supplied by springs 325 keeps the anode pressed against hard stop 385. During plating, a wafer holder (not shown) holds a wafer at a fixed level (indicated by the dotted line) above the anode. As the anode is consumed, distance A is maintained. Thus the term "front referenced anode" may be used to describe how the anode's "front" face is referenced so that it stays in the same position during plating.

Figure 4:
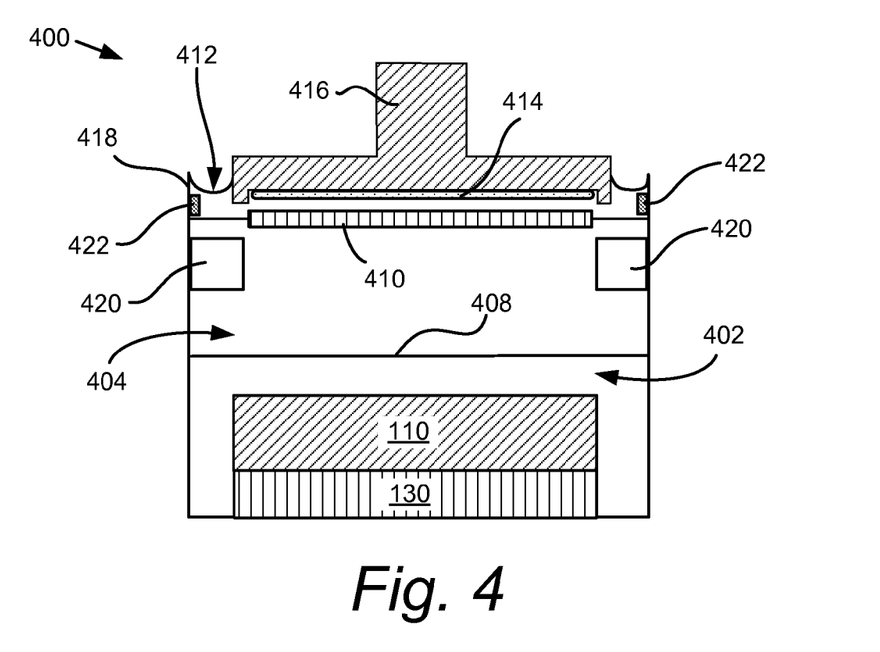
FIG. 4 depicts a cross section schematic of anode supports described herein in relation to plating cells employing one or more components for field shaping and controlling during plating.

The particular configuration of the apparatus in FIGS. 3A-C is one embodiment of an anode assembly and does not limit the scope of the invention. Further, the apparatus described herein can be used with a variety of plating cells. Such plating cells may include one or more features including field shaping elements, auxiliary cathodes, semi-permeable membranes for defining separate anode and cathode chambers, and the like. Such features are exemplified in U.S. Pat. No. 8,475,636, filed Jul. 2, 2013, titled, "Method and Apparatus for Electroplating," naming Steven T. Mayer, et. al. as inventors, which is hereby incorporated by reference herein for all purposes. FIG. 4 describes one such cell generically, so as to provide context to subsequent description herein.

FIG. 4 shows a schematic cross section of an exemplary electroplating apparatus, 400, in which the anode assemblies described herein may be employed. For the sake of clarity, the anode assembly components, for example anode support and positioning mechanism are not shown in FIG. 4, but are described in further detail with respect to an exemplary plating apparatus described in relation to FIGS. 5A-5F.

Electroplating system 400 includes an electroplating chamber that contains an anode chamber and a cathode chamber. The anode chamber includes two chambers, a "lower" anode chamber including a separated anolyte chamber (SAC) 402 where the anode assembly (including anode 110 and anode support 130 which includes an anode positioning mechanism as described herein) resides, and an upper diffusion chamber 404 (also referred to as a HRVA chamber or a catholyte chamber), separated from the separated anolyte chamber by a cationic membrane 408. The diffusion chamber contains a highly resistive ionically permeable element (sometimes referred to as a highly resistive virtual anode, or HRVA) 410, described above, and an electrolyte solution (sometimes referred to as the catholyte), which is shown at a level 412. The separated anolyte chamber also contains an electrolyte solution (sometimes referred to as the anolyte), which may or may not be the same type of electrolyte in the diffusion chamber.

The HRVA 410 is located in close proximity (within 10 mm, preferably within 5 mm) of a wafer, 414, and serves as a high resistance ionic current source to the wafer. The element contains a plurality of 1D through channels and is described in detail in U.S. Pat. No. 8,475,636, incorporated by reference above.

Wafer 414 is held and positioned by wafer holder 416, and immersed in the electrolyte solution (i.e., the catholyte). In some embodiments, the wafer holder 416 is a clamshell apparatus which makes contacts to the periphery of the wafer through a number of contact fingers housed behind a typically elastic "lip seal", which serves to seal the clamshell and keep the edge contact region and wafer backside substantially free of electrolyte, as well as to avoid any plating onto the contacts. A general description of a clamshell-type plating apparatus having aspects suitable for use with this invention is described in detail in U.S. Pat. No. 6,156,167 issued to Patton et al., and U.S. Pat. No. 6,800,187 issued to Reid et al., which are both incorporated herein by reference for all purposes.

Cationic membrane 408 allows ionic communication between the separated anolyte chamber and the diffusion chamber, while preventing the particles generated at the anode from entering the proximity of the wafer and contaminating it. The cationic membrane is also useful in prohibiting non-ionic and anionic species such as bath additives from passing though the membrane and being degraded at the anode surface, and to a lesser extent in redistributing current flow during the plating process and thereby improving the plating uniformity. Detailed descriptions of suitable ionic membranes are provided in the following US Patents and patent applications: U.S. Pat. Nos. 6,126,798 and 6,569,299 issued to Reid et al., U.S. Pat. No. 8,475,637, entitled Electroplating Apparatus With Vented Electrolyte Manifold, issued Jul. 2, 2013, U.S. Patent Application Ser. No. 61/139, 178, entitled PLATING METHOD AND APPARATUS WITH MULTIPLE INTERNALLY IRRIGATED CHAM- BERS, filed Dec. 19, 2008, each of which is incorporated herein by reference for all purposes.

Electrolyte solutions are continuously provided to the separated anolyte chamber and the diffusion chamber by separate pumps (not shown). For the diffusion chamber, electrolyte enters the chamber through a manifold (not shown) and exits by flowing over weir wall 418.

Electroplating apparatus 400 also contains an auxiliary cathode 420 and a second auxiliary cathode 422. In the depicted embodiment, auxiliary cathode 420 and second auxiliary cathode 422 are virtual cathodes, with associated physical cathodes (not shown). In other embodiments, one or both of the virtual cathodes are replaced by physical cathodes, and the physical cathode is simply located at the position of the virtual cathode. The electroplating apparatus performs in a similar manner with either virtual cathodes or physical cathodes (with no virtual cathodes). The use of virtual cathodes provides advantages, however. Further description of the cathodes, HRVA, anode and their interrelationship is described in detail in U.S. Pat. No. 8,475,636, incorporated by reference above.

Thus, apparatus 400 includes an ionically resistive ionically permeable element located in close proximity of the wafer and at least one auxiliary cathode located between the anode and the ionically resistive ionically permeable element. The ionically resistive ionically permeable element serves to modulate ionic current at the wafer surface. The auxiliary cathode is configured to shape the current distribution from the anode. The configuration effectively redistributes ionic current in the plating system allowing plating of uniform metal layers and mitigating the terminal effect. Anode support 130 maintains a consistent gap between the plating surface of wafer 414 and the consumed surface of the anode 110, as described herein. This aids in uniform plating by maintaining a substantially constant field configuration between the wafer and the anode, because, among other things, the gap does not change during plating.

Figure 5A:
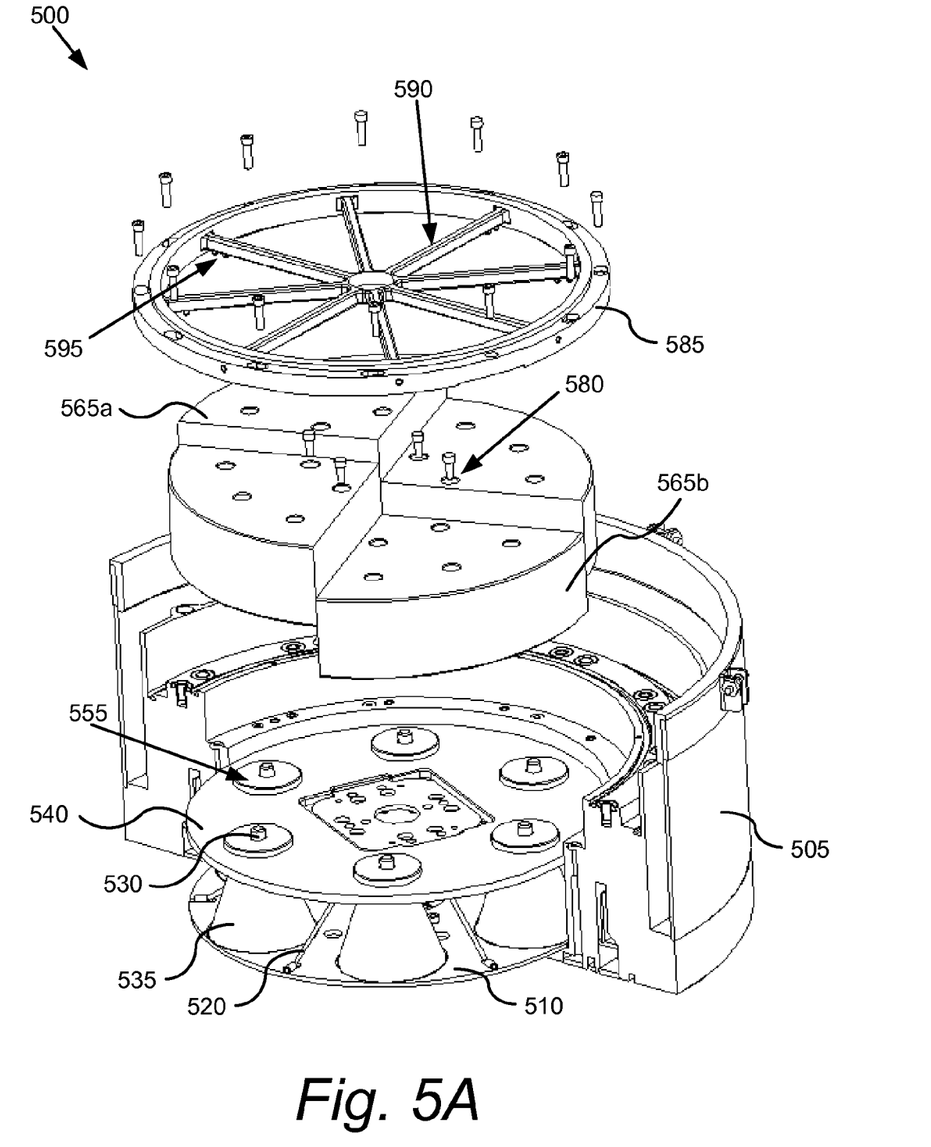
FIGS. 5A-5F depict various illustrations of a plating apparatus.
Figure 5B:
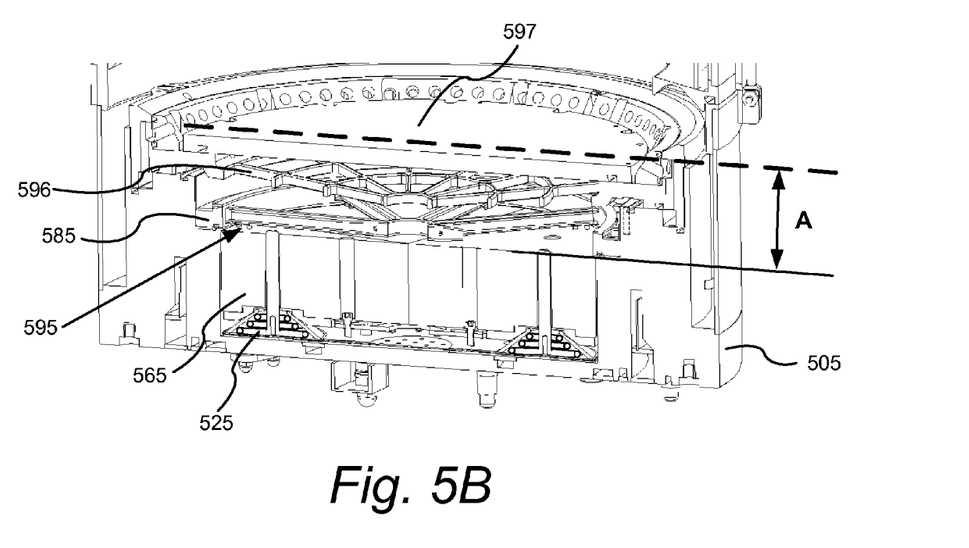
Figure 5C:
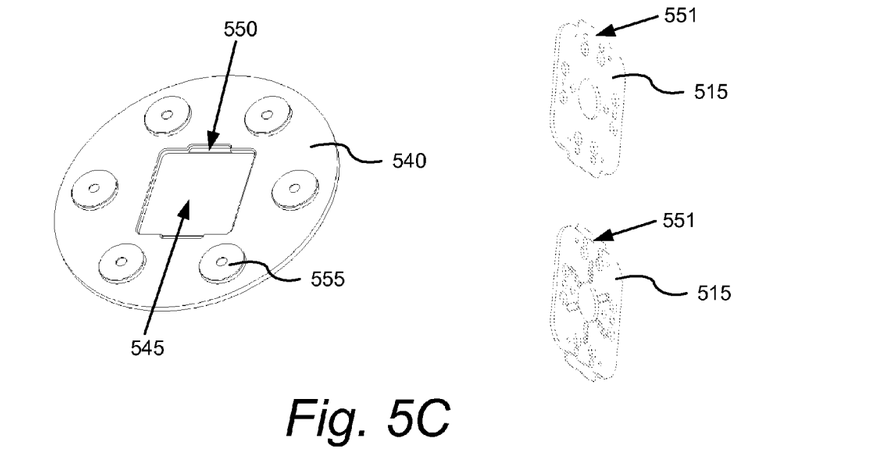

FIGS. 5A-F depict aspects of a plating apparatus which incorporates anode assemblies as described herein. FIG. 5A depicts an assembly, 500, which includes a plating cell, 505, and analogous components to those described in relation to FIGS. 3A-C, but with some differences. Base plate, 510, is connected to charge plate, 515, via cables, 520. Springs 525 (see FIG. 5B) reside inside boots, 535. The top of guide rods, 530, can be seen protruding through apertures in protrusions, 555, on support plate 540. In FIG. 5A, charge plate 515 is engaged with support plate, 540. Referring to FIG. 5C, the hollow, 545, in support plate 540 is rectangular. Depressions, 550, engage with perimeter tabs, 551, of charge plate 515. In this example, in order to engage the charge plate and the support plate, the anode assembly is compressed as described above, and charge plate 515 is passed through hollow 545. In this example, charge plate 515 need not also be rotated, but rather, when it is brought through hollow 545 it is tilted out of plane of support plate 540 (when in plane with support plate 540, charge plate 515 will not pass through hollow 545). Once the charge plate is entirely through hollow 545, the charge plates is brought parallel to the plane of the support plate and the support plate is allowed to rise by the force of the springs. This engages the support plate with the charge plate as depicted in FIG. 5A. In this example, cables 520 limit charge plate 515 from traveling (vertically) past the full extension of springs 525. This means that when the springs press against support plate 540, depressions 550 engage perimeter tabs 551 and the support plate is prevented from traveling (vertically) past the charge plate. Note that guide rods 530 protrude from the apertures in protrusions 555 in this configuration (see FIG. 5A); this aids in registration of the assembled anode sectors with the support plate. Note also that protrusions 555 have corresponding depressions under support plate 540. The top of springs 525 seat in these depressions (see FIG. 5B).

Figure 5D:
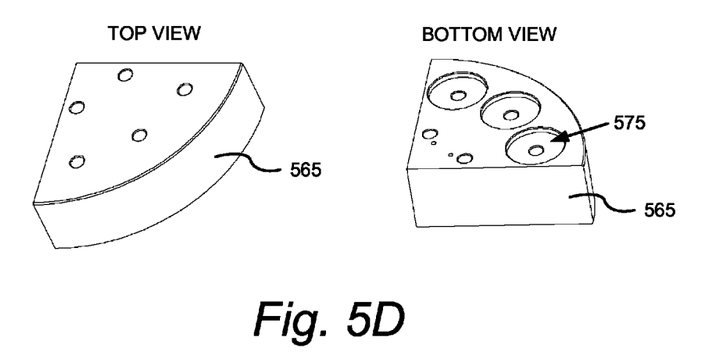
Figure 5E:
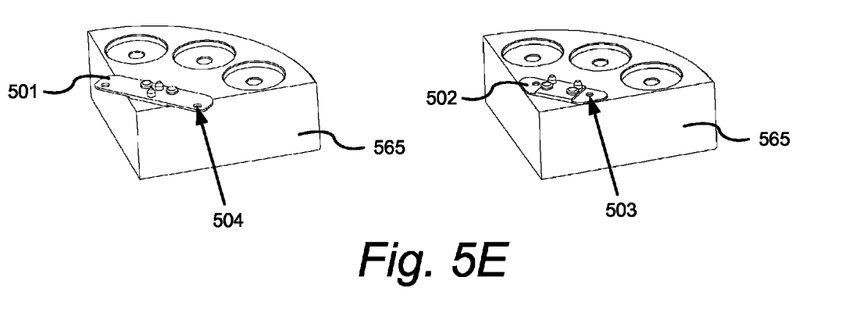
Figure 5F:
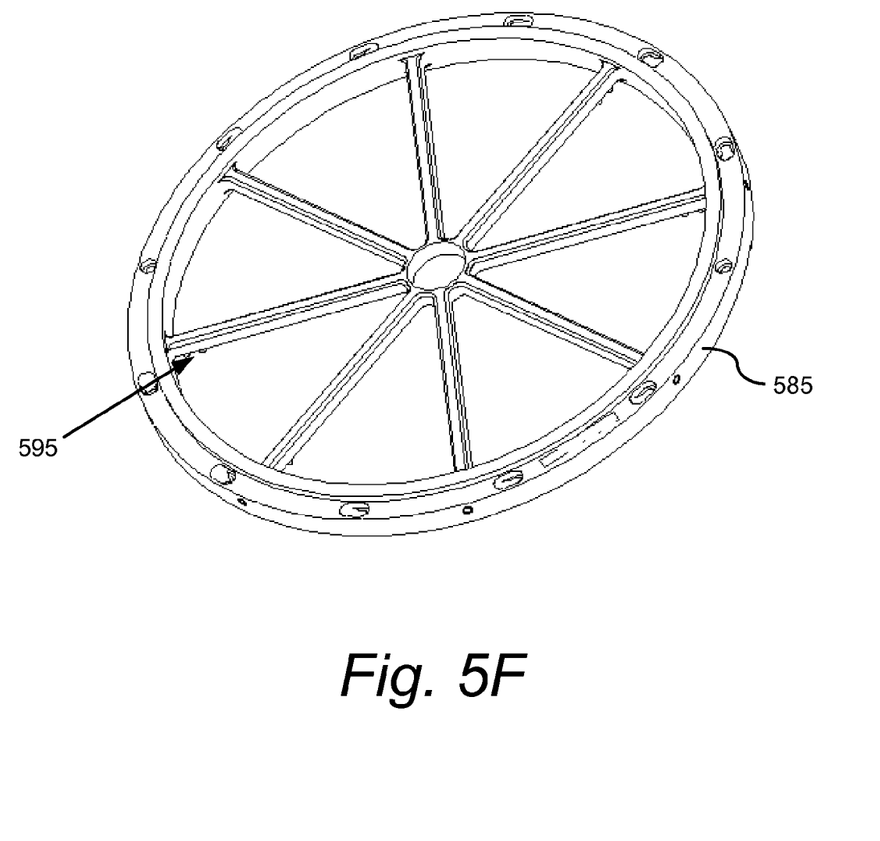

In this example, anode sectors 565 are fastened together and bolted to charge plate 515. Referring to FIGS. 5D-E, the top (as depicted in FIG. 5D) surface of each anode sector has a substantially planar surface, although there are, for example, apertures as described for passing guide rods 530 and fasteners through as described in relation to FIGS. 3A-C. Anodes described herein may have local deviations from planarity such as ridges, depressions and the like. Based on modeling and actual plating performance, it is expected that plated film thickness profile will not show obvious change when topography of the front surface of the anode varies by between about 5 mm and about 10 mm. Thus it, local deviations from planarity will not change the plating uniformity performance unless the deviation is greater than about 10 mm. In one embodiment, the top surface of the consumable anode has a topography that varies no more than 10 mm in height on average. Referring to FIGS. 5D-E, channels in the anode segments for bolting the anode segments to the charge plate are deeper than 10 mm. However, these deviations in height beyond 10 mm are localized and do not affect plating uniformity for two reasons: 1) because the wafer is typically rotating during plating, any changes in the field produced by the holes (null field) is averaged from the perspective of the rotating wafer, and 2) because the gap between the anode and the wafer is on the order of inches, the field around the holes confluences at a distance above the holes so that the overall effect of these localized deviations in height do not translate into plating non-uniformity. In one embodiment, these holes are occupied with copper plugs to compensate for any variation in the field.

FIG. 5D also shows the bottom surface of each anode sector, 565. Depressions, 575, in this example circular depressions, register with protrusions 555 on support plate 540, when the anode is engaged with support plate 540. Referring to FIG. 5E, connectors, 501 and 502, are fastened to two each of the anode sectors 565. Two anode sectors, having connector 501 fastened thereto, are placed onto the charge plate opposite each other, for example as sectors 565*a* and 565*b* are positioned in FIG. 5A. The portion of connector 501 that overhangs each of the two anode sectors is used to support the remaining two sectors, each bearing connector 502. Since connector 502 has no overhang, these anode sectors can be slid downward and into the space between anode sectors 565*a* and 565*b*. Fasteners, for example bolts or screws, are introduced into through channels, 580, and they pass through an aperture, 503, in connector 502 and aperture, 504, in the overhang portion of connector 501, and fasten to charge plate 515. In this way, the anode sectors are fastened to each other and to charge plate 515.

In this example a hard stop, 585, is configured as a spoked wheel. In this example, the individual spokes, or flutes, 590, are hollow for flowing electrolyte therethrough, and have apertures (not shown) which flow electrolyte onto the anode surface during plating to aid in preventing passivation of the anode surface. Hard stop 585 has protrusions, in this case configured as "bumps," 595, (see also FIGS. 5B and 5F) that rest against the surface of the anode during plating, thus minimizing physical contact between the hard stop and the anode. This configuration also allows flutes 590 to have apertures on their surface proximate to the anode surface, and thus electrolyte can flow more efficiently to the surface of the anode during plating to help prevent passivation. Referring to FIG. 5B, which shows the anode assembly inside plating chamber 505, hard stop 585 is depicted fastened to the plating chamber and holding down the anode sectors 365. Also included in this cell is a membrane, 596, for example as described in relation to FIG. 4, which creates a lower anode chamber housing the anode, and between membrane 596 (membrane support structure indicated) and a HRVA, 597, is the upper anode chamber. A wafer holder (not shown) positions the wafer (not shown) at a fixed height (as indicated by the dashed line), and thus the gap, A, between the anode and the wafer is established. During plating, as the anode is consumed, the anode support, via its positioning mechanism, maintains gap distance A. One embodiment is an anode assembly, and/or components thereof, as described herein.

Figure 6:
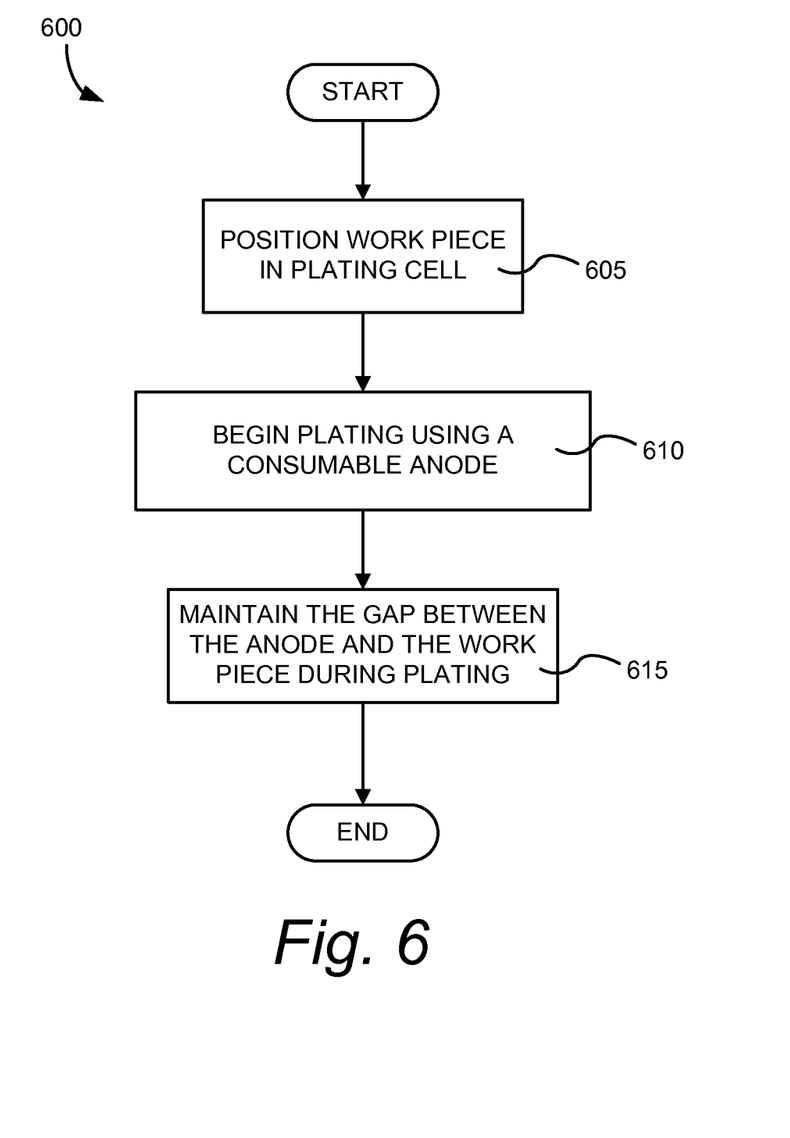
FIG. 6 depicts aspects of a process flow.

Another embodiment is a method of electroplating a metal onto a work piece, the method including maintaining a consistent distance between the plating surface of the work piece and a surface of a consumable anode during plating, by adjusting the position of the consumable anode during plating to compensate for consumption of the surface of the consumable anode. FIG. 6 depicts aspects of a process flow, 600, outlining such methods. Referring to FIG. 6, a work piece is positioned in a plating cell, see 605. Then plating is started, the plating employing a consumable anode, see 610. During plating, the gap between the work piece and the anode are maintained, see 615, then the process flow is complete. In one embodiment, the consistent distance between the anode and work piece varies during plating by no more than about 10 µm, in another embodiment, no more than about 5 µm, in another embodiment, no more than about 2 µm. When plating, for example, 300 mm semi-conductor wafers with copper, using an anode (segmented or not) that weighs on the order of 30-40 kg, the anode thickness changes very little during each wafer plating (in range of 1 µm to 1.5 µm). However, by maintaining a consistent distance during plating, continuous tool operation times are increased without sacrificing uniformity. For example, in conventional plating tools, an anode might be on the order of 3 cm to 4 cm thick. Typically the anode would not be made thicker, because the gap increases over time, due to the anode being consumed; gap changes larger than about 2 or 3 cm would bring plating non-uniformity into unacceptable ranges. In applications demanding higher plating uniformity, even this conventional gap change is unacceptable. Using methods and apparatus of the invention, anodes can be, for example, 10 cm thick (or more) and about 90% or more of the anode can be used without changing the gap and therefore high plating uniformity is maintained. Theoretically, all of the anode could be used, the current limitations being related only to existing hardware used to mount the anode, for example screws holding the anode to the charge plate, interfering with the localized field. In one embodiment, this limitation is overcome by appropriate mounting of the anode so that nearly all of the anode can be used without sacrificing uniformity. To put this example in perspective, using methods and apparatus of the invention, an anode that is on the order of 10 cm thick (for plating on 300 mm wafers) that weighs on the order of 30-40 kg, can be used for months to plate tens of thousands of wafers while maintaining a consistent gap and therefore without sacrificing plating uniformity.

In one embodiment, the work piece is a semiconductor wafer. In certain embodiments, the surface of the consumable anode comprises a substantially planar surface that is substantially parallel to the plating surface of the semiconductor wafer during plating. In some embodiments, the substantially planar surface is at least co-extensive with the plating surface of the semiconductor wafer.

In certain embodiments, apparatus as described herein are used to implement the methods described. Copper electroplating is employed in certain embodiments. In certain embodiments, apparatus include plating chambers as described herein and in the incorporated references. For example, in one embodiment, the work piece and the consumable anode are provided in a plating chamber including: (i) an ionically resistive ionically permeable element located between the work piece and the consumable anode during plating, the ionically resistive ionically permeable element having a flat surface that is substantially parallel to and separated from the plating surface of the work piece by a gap of about 5 millimeters or less during electroplating; and (ii) an auxiliary cathode located between the consumable anode and the ionically resistive ionically permeable element during plating, the auxiliary cathode peripherally oriented to shape the current distribution from the consumable anode, while the auxiliary cathode is supplied with current during electroplating. In one embodiment, the ionically resistive ionically permeable element has an ionically resistive body with a plurality of non-communicating channels through the body, where said plurality of non-communicating channels allow for transport of ions through the element, and wherein substantially all channels have a principal dimension or a diameter of the opening on the surface of the element facing the surface of the work piece of no greater than about 5 millimeters. In certain embodiments, the ionically resistive ionically permeable element is a disk having between about 6,000-12,000 channels and/or has a porosity of about 5% porous or less. Some embodiments further include positioning a second auxiliary cathode in substantially the same plane as the plating surface of the work piece during electroplating, and said secondary auxiliary cathode adapted for diverting a portion of ionic current from an edge region of the work piece. In one embodiment, the second auxiliary cathode is located peripheral to the work piece holder and radially outward of a peripheral gap between the ionically resistive ionically permeable element and the work piece holder. In some embodiments, the auxiliary cathode is a virtual auxiliary cathode having an associated physical cathode housed in a cavity in the plating chamber, where the cavity is in ionic communication with the plating chamber. In certain embodiments, methods described herein further include positioning a second ionically resistive ionically permeable element proximate the auxiliary cathode during plating.

Although the foregoing invention has been described in some detail to facilitate understanding, the described embodiments are to be considered illustrative and not limiting. It will be apparent to one of ordinary skill in the art that certain changes and modifications can be practiced within the scope of the appended claims.

We claim:

1. A consumable anode for an electroplating apparatus, the consumable anode comprising:
   a plurality of sections, wherein each section has a first surface and a second surface, substantially parallel to the first surface, wherein both the first and the second surfaces have a shape of a sector of a circle, wherein each of the sections has a plurality of through channels connecting the first and second surfaces, wherein one of the first and second surfaces has at least one depression configured for registering with a protrusion on a component of an anode assembly, and wherein the at least one depression surrounds at least one through channel of the plurality of the through channels.

2. The consumable anode of claim 1, wherein the sector of the circle has a central angle of 90 degrees and the anode has four sections.

3. The consumable anode of claim 1, wherein the sector of the circle has a central angle of 120 degrees, and the anode has three sections.

4. The consumable anode of claim 1, wherein the sector of the circle has a central angle of 180 degrees and the anode has two sections.

5. The consumable anode of claim 1, wherein each anode segment comprises a plurality of depressions configured for registering with protrusions on a component of an anode assembly.

6. The consumable anode of claim 1, wherein the at least one depression is a circular depression.

7. An anode assembly comprising:
(a) a consumable anode for an electroplating apparatus, the consumable anode comprising a plurality of sections, wherein each section has a first surface and a second surface, substantially parallel to the first surface, wherein both the first and the second surfaces have a shape of a sector of a circle, wherein each of the sections has a plurality of through channels connecting the first and second surfaces, and wherein one of the first and second surfaces has a plurality of depressions;
(b) a support plate comprising a plurality of protrusions configured to register with the plurality of depressions on the consumable anode; and
(c) a base plate comprising a plurality of springs configured to be compressed against the support plate.

8. The anode assembly of claim 7, further comprising a charge plate, wherein the charge plate is connected to a power supply via cables attached to the charge plate.

9. The anode assembly of claim 8, wherein the anode segments are bolted to the charge plate.

10. The anode assembly of claim 7, wherein at least two anode segments are fastened to each other.

11. The anode assembly of claim 7, wherein the base plate further comprises a plurality of guiding rods, wherein said guiding rods are configured to pass through a portion of the plurality of through channels of the consumable anode.

12. The anode assembly of claim 11, wherein each guiding rod is located in the center of each spring of the plurality of springs.

13. An anode assembly comprising:
(a) a consumable anode for an electroplating apparatus, the consumable anode comprising a plurality of sections, wherein each section has a first surface and a second surface, substantially parallel to the first surface, wherein both the first and the second surfaces have a shape of a sector of a circle, wherein each of the sections has a plurality of through channels connecting the first and second surfaces, and wherein one of the first and second surfaces has a plurality of depressions;
(b) a support plate comprising a plurality of protrusions configured to register with the plurality of depressions on the consumable anode; and
(c) fasteners passing through the plurality of through channels of the anode.

14. The anode assembly of claim 13, wherein the fasteners are bolts attaching the anode segments to a charge plate.

* * * * *